United States Patent
Czornomaz et al.

(10) Patent No.: US 9,823,414 B2
(45) Date of Patent: Nov. 21, 2017

(54) METHOD FOR FABRICATING A SEMICONDUCTOR DEVICE FOR USE IN AN OPTICAL APPLICATION

(71) Applicant: INTERNATIONAL BUSINESS MACHINES CORPORATION, Armonk, NY (US)

(72) Inventors: Lukas Czornomaz, Zurich (CH); Jens Hofrichter, Gattikon (CH); Mirja Richter, Kilchberg (CH); Heike E. Riel, Baech (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/178,913

(22) Filed: Jun. 10, 2016

(65) Prior Publication Data
US 2016/0291249 A1   Oct. 6, 2016

Related U.S. Application Data

(60) Continuation of application No. 14/867,184, filed on Sep. 28, 2015, now Pat. No. 9,459,405, which is a (Continued)

(51) Int. Cl.
*H01L 21/00* (2006.01)
*G02B 6/122* (2006.01)
(Continued)

(52) U.S. Cl.
CPC ....... *G02B 6/1225* (2013.01); *G02B 6/12004* (2013.01); *G02B 6/124* (2013.01);
(Continued)

(58) Field of Classification Search
CPC ......... H01L 21/00; H01L 33/62; H01L 33/58; G02B 6/61225; G02B 6/136; G01B 6/12004

See application file for complete search history.

(56) References Cited

U.S. PATENT DOCUMENTS 5,259,049 A   11/1993   Bona et al.
5,703,896 A   12/1997   Pankove et al.
(Continued)

FOREIGN PATENT DOCUMENTS

CN   101527429 A   9/2009
JP   2011096981 A   5/2011

OTHER PUBLICATIONS

Wu et al., "Electrically pumped circular-grating distributed-Bragg-reflector lasers," IEEE Photonics Technology Letters, vol. 4, Issue 9, pp. 960-963, Sep. 1992.
(Continued)

*Primary Examiner* — Phuc Dang
(74) *Attorney, Agent, or Firm* — Kurt Goudy

(57) ABSTRACT

A semiconductor device for use in an optical application and a method for fabricating the device. The device includes: an optically passive aspect that is operable in a substantially optically passive mode; and an optically active material having a material that is operable in a substantially optically active mode, wherein the optically passive aspect is patterned to include a photonic structure with a predefined structure, and the optically active material is formed in the predefined structure so as to be substantially self-aligned in a lateral plane with the optically passive aspect.

24 Claims, 6 Drawing Sheets

Related U.S. Application Data division of application No. 14/166,085, filed on Jan. 28, 2014, now Pat. No. 9,239,424.

(51) Int. Cl.

| | |
|---|---|
| *G02B 6/12* | (2006.01) |
| *H01S 5/00* | (2006.01) |
| *G02B 6/124* | (2006.01) |
| *G02B 6/136* | (2006.01) |
| *G02B 6/42* | (2006.01) |
| *H01L 31/18* | (2006.01) |
| *H01L 33/00* | (2010.01) |
| *H01S 5/183* | (2006.01) |
| *H01S 5/10* | (2006.01) |
| *H01S 5/026* | (2006.01) |

(52) U.S. Cl.
CPC ........... *G02B 6/1228* (2013.01); *G02B 6/136* (2013.01); *G02B 6/42* (2013.01); *H01L 31/18* (2013.01); *H01L 33/005* (2013.01); *H01S 5/00* (2013.01); *H01S 5/1032* (2013.01); *H01S 5/183* (2013.01); *G02B 2006/12107* (2013.01); *G02B 2006/12197* (2013.01); *H01S 5/026* (2013.01); *H01S 5/105* (2013.01)

(56) References Cited

U.S. PATENT DOCUMENTS

| | | | |
|---|---|---|---|
| 6,163,639 A | | 12/2000 | Ollier et al. |
| 6,309,904 B1 * | | 10/2001 | Pommereau ....... G02B 6/12004 216/24 |
| 6,711,200 B1 | | 3/2004 | Scherer et al. |
| 7,305,157 B2 | | 12/2007 | Ahn et al. |
| 7,418,166 B1 | | 8/2008 | Kapur et al. |
| 7,582,910 B2 | | 9/2009 | David et al. |
| 7,603,016 B1 | | 10/2009 | Soref |
| 7,760,980 B2 | | 7/2010 | West et al. |
| 2003/0215968 A1 * | | 11/2003 | Peterson ................ G02B 6/136 438/27 |
| 2004/0218648 A1 | | 11/2004 | Sung et al. |
| 2005/0141801 A1 * | | 6/2005 | Gardner ................ B82Y 20/00 385/2 |
| 2007/0104441 A1 | | 5/2007 | Ahn et al. |
| 2007/0105251 A1 | | 5/2007 | Liu et al. |
| 2008/0002929 A1 | | 1/2008 | Bowers et al. |
| 2008/0198888 A1 | | 8/2008 | Arimoto |
| 2009/0245298 A1 | | 10/2009 | Sysak et al. |
| 2009/0257466 A1 * | | 10/2009 | Eberhard ................ H01L 33/44 372/45.01 |
| 2010/0187966 A1 | | 7/2010 | Mochizuki |
| 2010/0207254 A1 * | | 8/2010 | Jain ...................... H01L 31/105 257/629 |
| 2010/0295083 A1 | | 11/2010 | Celler |
| 2014/0175423 A1 * | | 6/2014 | Jeong ................ H01L 29/66969 257/43 |
| 2015/0093069 A1 * | | 4/2015 | Nakamura ........... G02B 6/4228 385/14 |

OTHER PUBLICATIONS

Li et al., "Defect reduction of GaAs epitaxy on Si (001) using selective aspect ratio trapping", published in Appl. Phys. Lett., vol. 91, 021114, 2007.

Li et al., "Monolithic integration of GaAs/InGaAs lasers on virtual Ge substrates via aspect-ratio trapping", published in J. Electrochem. Soc. 156, H574, 2009.

Bjoerk et al., "Si—InAs heterojunction Esaki tunnel diodes with high current densities", published in Appl. Phys. Lett., vol. 97, 163501, 2010.

Fang et al., "Electrically pumped hybrid AlGaInAs-silicon evanescent laser", published in Optics Express, vol. 14, issue 20, pp. 9203-9210, 2006.

Van Campenhout et al., "Electrically pumped InP-based microdisk lasers integrated with a nanophotonic siliconon-insulator waveguide circuit", published in Optics Express, vol. 15, issue 11, pp. 6744-6749, 2007.

Boucart et al., "Metamorphic DBR and tunnel-junction injection: A CW RT monolithic long-wavelength VCSEL", published in IEEE J. Sel. Topics Quantum Electron, vol. 5, issue 3, pp. 520-529, 1999.

Baumann et al., "Design and optical characterisation of photonic crystal lasers with organic gain material", published in Journal of Optics, vol. 12, 065003, 2010.

Baumann et al., "Organic mixed-order photonic crystal lasers with ultrasmall footprint", published in Appl. Phys. Lett., vol. 91, 171108, 2007.

Halioua et al., Hybrid III-V semiconductor/silicon nanolaser, published in Optics Express, vol. 19, 9221, 2011.

\* cited by examiner

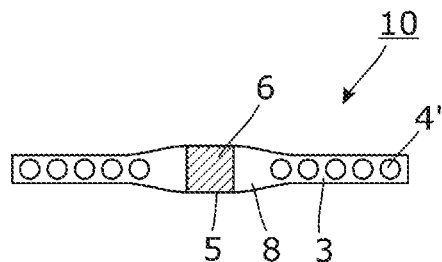
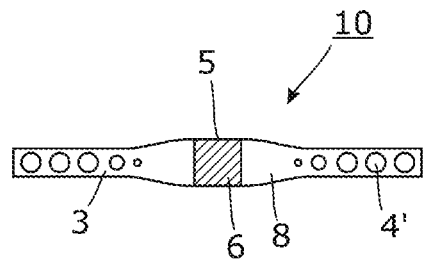
Fig. 4A Fig. 4B
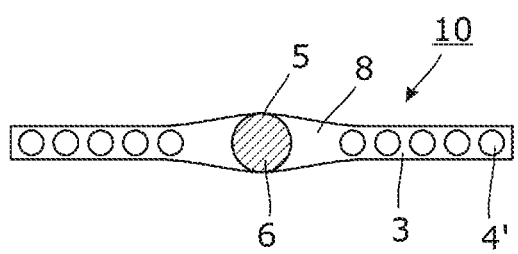
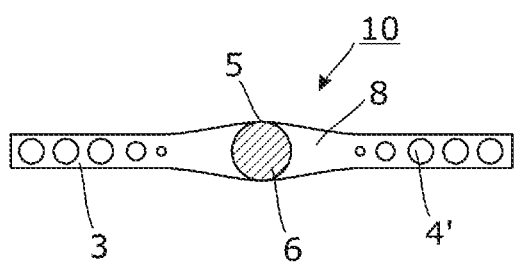
Fig. 4C Fig. 4D
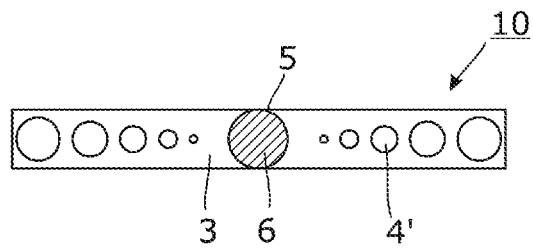
Fig. 4E

METHOD FOR FABRICATING A SEMICONDUCTOR DEVICE FOR USE IN AN OPTICAL APPLICATION

CROSS-REFERENCE TO RELATED APPLICATION

This application is a continuation of U.S. patent application Ser. No. 14/867,184, filed Sep. 28, 2015, which is divisional of U.S. Pat. No. 9,239,424, granted Jan. 19, 2016, the entire contents of which are incorporated herein by reference.

BACKGROUND

1. Field of the Invention

The present invention relates to a semiconductor device for use in an optical application and a method for fabricating the device.

2. Description of the Related Art

In order to meet the requirements of future computing systems, higher speed and more energy efficient alternatives to electrical interconnects, such as on-chip optical interconnects and chip-to-chip optical interconnects, will be needed. Integrated optics, particularly silicon photonics, can suitably meet such needs. For the cost-effective, mass-fabrication of CMOS-based chips having a performance capability suitable for use in high-speed devices and/or applications, integrated optical interconnects with compatible light sources are to be provided. A problem in this regard is that, due to the indirect band-gap of silicon, no silicon-based light sources are available and/or can be used. This problem has been addressed by the use of III-V based semiconductor material systems typically being provided as light sources for use in conjunction with silicon photonics and, more generally, integrated optics based on a silicon platform. However, an associated problem in this regard is posed by the lattice mismatch between III-V compound semiconductors and silicon, making the direct, monolithic integration of III-V based light sources on a silicon platform non-trivial. In previously-proposed approaches for facilitating such integration, bonded III-V based light sources or blanket gain materials have been used. In this regard, it can be time-consuming and challenging to achieve relatively high-precision alignment when bonding a pre-processed III-V based light source to a given waveguide structure, particularly since the alignment precision can be further limited by the bonding process. For bonding a blanket III-V material on a pre-processed silicon-based waveguide, the alignment marks located on the silicon wafer that are provided for the lithography step involved in the patterning of the III-V layer can be used. Because the alignment accuracy of light sources based on compound semiconductor systems, such as III-V materials, with respect to optical structures, for example, silicon waveguides and/or resonators, can be rather dependent on lithography accuracy, it can be insufficient for certain applications.

Referring to the document titled, "Defect reduction of GaAs epitaxy on Si (001) using selective aspect ratio trapping", by Li et al. published in Appl. Phys. Lett., vol. 91, 021114, 2007, in which III-V epitaxy in oxide trenches on silicon has been reported using aspect ratio trapping. Reference is also made to the document titled, "Monolithic integration of GaAs/InGaAs lasers on virtual Ge substrates via aspect-ratio trapping", by Li et al. published in J. Electrochem. Soc. 156, H574, 2009, in which the formation of GaAs/InGaAs quantum well lasers, by metallorganic chemical vapour deposition, on virtual Ge substrates on silicon has been demonstrated via aspect ratio trapping and epitaxial lateral overgrowth. These documents are respectively concerned with addressing other known problems associated with the fabrication of structures having compound semiconductor material systems, such as III-V material systems, on silicon, which can cause performance deterioration of devices in which such structures are integrated. Such problems are related to the lattice mismatch and difference in thermal coefficients between III/V material systems and silicon. However, neither of these documents address the problems, as discussed above, associated with the alignment of compound semiconductor systems that are monolithically integrated and optically coupled with optical structures, for example, waveguides and, more generally, photonic structures.

In the document titled, "Si—InAs heterojunction Esaki tunnel diodes with high current densities", by Bjoerk et al., published in Appl. Phys. Lett., vol. 97, 163501, 2010, III-V nanowire growth on silicon is discussed. The problems and/or issues associated with the alignment of compound semiconductor systems that are monolithically integrated and optically coupled with optical components, such as waveguides and/or photonic structures, are not addressed.

Referring to the documents titled, "Electrically pumped hybrid AlGaInAs-silicon evanescent laser", by Fang et al., published in Optics Express, vol. 14, issue 20, pp. 9203-9210, 2006, and "Electrically pumped InP-based microdisk lasers integrated with a nanophotonic silicon-on-insulator waveguide circuit", by Van Campenhout et al., published in Optics Express, vol. 15, issue 11, pp. 6744-6749, 2007. These documents generally disclose the alignment of an active lasing region towards a waveguide using contact lithography, with an alignment accuracy of better than 2 microns being achieved. Turning to the document titled, "Metamorphic DBR and tunnel-junction injection: A CW RT monolithic long-wavelength VCSEL", by Boucart et al., published in IEEE J. Sel. Topics Quantum Electron, vol. 5, issue 3, pp. 520-529, 1999, III-V light sources on silicon are described. This document publishes the fabrication of a long-wavelength, vertical-cavity, surface-emitting laser (VCSEL), which is monolithically integrated on an indium phosphide (InP) wafer, capable of operating at room temperature, and has a tunnelling junction for reduced losses sustained during operation. This document does not address the issues/problems associated with the alignment of compound semiconductors that are optically coupled to optical structures such as waveguides, and more particularly those based on a silicon platform.

In each of the documents titled, "Design and optical characterisation of photonic crystal lasers with organic gain material", published by Baumann et al. in Journal of Optics, vol. 12, 065003, 2010, and "Organic mixed-order photonic crystal lasers with ultrasmall footprint", by Baumann et al., published in Appl. Phys. Lett., vol. 91, 171108, 2007, spin-coating of an organic gain material onto a two-dimensional photonic crystal is reported. While suitable for organic gain material, spin-coating is not compatible with respect to solid state gain materials, such as III-V material systems.

US 2008/0002929 A1 describes an apparatus and a method for electrically pumping a hybrid evanescent laser. For one example, the apparatus includes an optical waveguide disposed in silicon. An active semiconductor material is disposed over the optical waveguide defining an evanescent coupling interface between the optical waveguide and the active semiconductor material such that an optical mode to be guided by the optical waveguide overlaps both the optical waveguide and the active semiconductor material. A current injection path is defined through the active semiconductor material and at least partially overlapping the optical mode such that light is generated in response to electrical pumping of the active semiconductor material in response to current injection along the current injection path at least partially overlapping the optical mode. In this document, the light generated by the active semiconductor material is evanescently coupled to a silicon waveguide that constitutes a passive aspect. Because the active semiconductor material is remotely positioned with respect to the silicon waveguide, it can be that the position of the generated light relative to passive aspect is relatively unchanged. Also, it can be that the overlap of the generated light with the active semiconductor material is relatively small, and so it can be expected that the teaching of the present document is based on a hybrid mode of operation, that is, a mainly passive mode with a relatively smaller active mode. Such a hybrid mode of operation can cause relatively higher threshold currents and lower optical output levels. Alignment issues can not be considered in the present document and, indeed are not addressed, since the position of the generated light is determined by the position of the underlying silicon waveguide. Positioning of the active semiconductor material relative to the underlying silicon waveguide can be facilitated by contact lithography with micron-scale precision in the present case.

US 2008/0198888 A1 discloses a method for bonding a compound semiconductor on a silicon waveguide for attaining a laser above a silicon substrate. This document is concerned with the heterogeneous integration, rather than the monolithic integration, of a light source based on a compound semiconductor material system with respect to a silicon substrate. Furthermore, such heterogeneous integration is achieved by optical contact-lithography, which has associated micron-range alignment tolerances.

US 2009/0245298 A1 discloses a silicon laser integrated device, including: a silicon-on-insulator substrate having at least one waveguide in a top surface, and a compound semiconductor substrate having a gain layer, the compound semiconductor substrate being subjected to a hybrid integration process, wherein the upper surface of the compound semiconductor substrate is bonded to the top surface of the silicon-on-insulator substrate. This document is concerned with the hybrid/heterogeneous integration, rather than the monolithic integration, of a surface of a compound semiconductor substrate with respect to a silicon-on-insulator substrate. Alignment between the compound semiconductor substrate and the silicon-on-insulator substrate is performed by optical contact-lithography, which has associated micron-range alignment tolerances. Based on the index contrasts of the fabricated structures, it can be that the light generated by the laser source/compound semiconductor aspect is mainly confined in the silicon with a relatively small proportion being confined within the compound semiconductor, which can serve to limit the efficiency of the laser and result in relatively increased power consumption.

U.S. Pat. No. 5,703,896 discloses an apparatus for emitting varying colours of light including: a lasing layer formed of crystalline silicon quantum dots formed in an isolation matrix of hydrogenated silicon; the quantum dots being formed in three patches; each of the three patches having different sized quantum dots therein to produce three different colours of light; a barrier layer of p-type semiconductor under the lasing layer, the p-type semiconductor being selected from the group GaP, SiC, GaN, ZnS; a substrate member under the barrier layer; an n-type semiconductor layer above the lasing layer, the n-type semiconductor layer being selected from the group GaP, SiC, GaN, ZnS; a positive potential contact beneath the substrate member, three negative potential contacts; each of the three contacts being above a different one of the three patches; each of the three contacts acting with the positive contact to selectively bias a different one of the three patches; three sectors of concentric grating surrounding the three patches; each of the sectors having a radial period corresponding to the colour of light produced by an adjacent one of the three patches; and each of the sectors resonating photons emitted by the adjacent patch to stimulate coherent light emission. This document is concerned with the fabrication of silicon quantum dots in silicon. It does not address the monolithic integration of a light/laser source based on a compound semiconductor such as, a III-V material system, with respect to an optical structure such as, a photonic structure and/or optical waveguide based on a silicon platform.

US 2007/0105251 discloses a laser structure including: at least one active layer including doped Ge so as to produce light emissions at approximately 1550 nm from the direct band-gap of Ge; a first confinement structure being positioned on a top region of the at least one active layer; and a second confinement structure being positioned on a bottom region of the at least one active layer. This document generally seems to be concerned with a VCSEL device. It does not seem to address the challenges faced in achieving alignment, on a scale of nanometers, of a light source based on a compound semiconductor material system that is monolithically integrated and optically coupled with an optical structure such as a waveguide based on a silicon platform.

US 2007/0104441 discloses an integrated photodetector apparatus including: (a) a substrate having a first cladding layer disposed over a base layer, the base layer having a first semiconducting material, the first cladding layer defining an opening extending to the base layer; (b) an optical waveguide having the first semiconductor material and disposed over the substrate; and (c) a photodetector having a second semiconductor material epitaxially grown over the base layer at least in the opening, the photodetector having an intrinsic region optically coupled to the waveguide, at least a portion of the intrinsic region extending above the first cladding layer and laterally aligned with the waveguide. The disclosed fabrication method is in relation to a germanium photodetector that is laterally coupled to a polycrystalline waveguide and is aligned relative thereto by way of a dedicated, multiple-step alignment procedure. This document does not address how a compound semiconductor based light source can be monolithically integrated and/or aligned, with an alignment tolerance on a scale of nanometers, with respect to integrated optics based on a silicon platform.

U.S. Pat. No. 5,259,049 discloses an electro-optical device including: a substrate; a laser grown on the substrate, and having an active region, an etched mirror, and a laser ridge thereon, wherein the shape of the laser ridge is transferred to the substrate so as to form a substrate ridge, the laser generating a beam; and an optical waveguide coupled to the mirror, and being deposited on the substrate ridge so as to be laterally aligned by the substrate ridge to the laser ridge, the optical waveguide effectively shaping the beam generated by the laser the optical waveguide including a lower cladding layer grown on top of the substrate ridge, a waveguide core disposed on top of the lower cladding layer, and an upper cladding layer disposed on top of the waveguide core, wherein the cladding layers and the waveguide core include material having refractive indices which match the refractive indices of the laser, wherein the upper and lower cladding layers have approximately the same refractive indices, and wherein the difference between the refractive index of the waveguide core and the refractive index of the upper cladding layer is equal to the difference between the refractive indices of the active layer of the laser and the upper cladding layer, respectively. This document discloses a device in which a pre-fabricated laser is coupled to a waveguide structure. The waveguide structure is arranged on top of the laser and is aligned thereto by way of a ridge feature associated with the laser.

U.S. Pat. No. 6,163,639 discloses a process for fitting connectors to optical elements to an integrated optical circuit consisting of connecting at least one optical element to this circuit such that the outputs and/or inputs of each element are located approximately in the same plane as the inputs and/or outputs of this circuit, also located in the same plane, characterised in that it includes the following steps: the circuit is positioned on a template with patterns that enable subsequent precise alignment of optical elements with inputs and/or outputs of the circuit, at least one block capable of holding the optical element(s) is positioned on the template facing the inputs and/or outputs of the circuit and is fixed to this circuit; the template is removed, and the optical element (s) is (are) placed in each block, the blocks then being aligned with the inputs and/or outputs of the circuit. This document discloses a passive alignment method for an optically active photonic circuit towards a waveguide section. Encompassed within the context of passive optical components in this document are waveguides or fibres and not cavities and/or nanophotonic on-chip waveguides. Regarding the passive optical components, they are inserted into dedicated alignment marks provided on the host substrate. The alignment marks are v-grooves etched into the host substrate, which can mean that the alignment tolerances are lithography dependent. Generally, this document does not address the monolithic integration of a light source based on a compound semiconductor material system with respect to integrated optics based on a silicon platform, and instead is concerned with providing hybrid integration of bulk photonic components with fibres. The described approach can be considered to be analogous with a packaging method for coupling an active III-V based chip with silica glass fibres. Alignment tolerances with the described approach can be insufficient for relatively large index contrast integrated photonic components.

US 2004/0218648 A1 discloses a laser diode including: a substrate; a lower material layer formed on the substrate; a resonance layer formed on the lower material layer, an upper material layer formed on the resonance layer and having a ridge at the top, a buried layer having a contact hole corresponding to the ridge of the upper material layer; a protective layer formed of a material different from the material of the buried layer, and having an opening corresponding to the contact hole of the buried layer; and an upper electrode formed on the protective layer to contact an upper surface of the ridge through the contact hole. This document discloses a device architecture and fabrication method for a low-leakage laser diode. An alignment process is described which relates to only the electronic injection part of the laser diode and not in respect of the material used as light source/laser with respect to the material including the integrated optics. It is also not addressed how optical coupling between the laser and the surrounding optical medium/integrated optics can be achieved.

Referring to the document titled, "Hybrid III-V semiconductor/silicon nanolaser", by Halioua et al., published in Optics Express, vol. 19, 9221, 2011, in which an optically pumped one-dimensional photonic cavity laser is vertically coupled to a pre-structured straight silicon waveguide. Alignment of the laser with respect to the silicon waveguide is performed by electron-beam lithography using markers formed in the silicon waveguide, with an overlay accuracy of better than 50 nm potentially being achieved. Although the <50 nm alignment precision is by far better than what can be achieved with optical contact lithography, it can still not be considered suitable for high quality-factor, low modal-volume micro-resonators, for example. Furthermore, electron-beam lithography is labour intensive, time-consuming, and expensive.

Accordingly, it is a challenge to monolithically integrate an optically active material, having a relatively high non-linearity, optical gain, light emission, with respect to surrounding passive optical/photonic structures/components, for example, waveguides and cavities. It is also desirable that such a task is performed with an alignment tolerance that is on the scale of nanometers and with the alignment procedure being conducted without dedicated alignment steps/lithographic processes and so as to be compatible with mass-fabrication.

SUMMARY OF THE INVENTION

According to an embodiment of a first aspect of the present invention, there is provided a semiconductor device for use in an optical application including: an optically passive aspect that is operable in a substantially optically passive mode, and an optically active material having a material that is operable in a substantially optically active mode, wherein: the optically passive aspect is patterned to include a photonic structure with a predefined structure, and the optically active material is formed in the predefined structure so as to be substantially self-aligned in a lateral plane with the optically passive aspect.

According to an embodiment of a second aspect of the present invention, a method for fabricating a semiconductor device for use in an optical application is provided. The method includes: providing an optically passive aspect that is operable in a substantially optically passive mode, and providing an optically active material having a material that is operable in a substantially optically active mode, wherein: the optically passive aspect is patterned to include a photonic structure with a predefined structure, and the optically active material is formed in the predefined structure so as to be substantially self-aligned in a lateral plane with the optically passive aspect.

BRIEF DESCRIPTION OF THE SEVERAL VIEWS OF THE DRAWINGS

Reference will now be made, by way of example, to the accompanying drawings.

FIG. 4a illustrates a second coupling scheme with a lateral cavity feature where the predefined structure is implemented as a trench and periodic holes are substantially the same size, according to an embodiment of the present invention.

FIG. 4b illustrates a second coupling scheme with a lateral cavity feature where the predefined structure is implemented as a trench and the periodic holes progressively increase in size, according to an embodiment of the present invention.

FIG. 4c illustrates a second coupling scheme with a lateral cavity feature where the predefined structure is implemented as a hole and the periodic holes are substantially the same size, according to an embodiment of the present invention.

FIG. 4d illustrates a second coupling scheme with a lateral cavity feature where the predefined structure is implemented as a hole and the periodic holes progressively increase in size, according to an embodiment of the present invention.

FIG. 4e illustrates a second coupling scheme with a lateral cavity feature where the silicon waveguide has a cross-section that is substantially the same size as the predefined structure and the periodic holes progressively increase in size, according to an embodiment of the present invention.

DETAILED DESCRIPTION OF THE PREFERRED EMBODIMENTS

Figure 1:
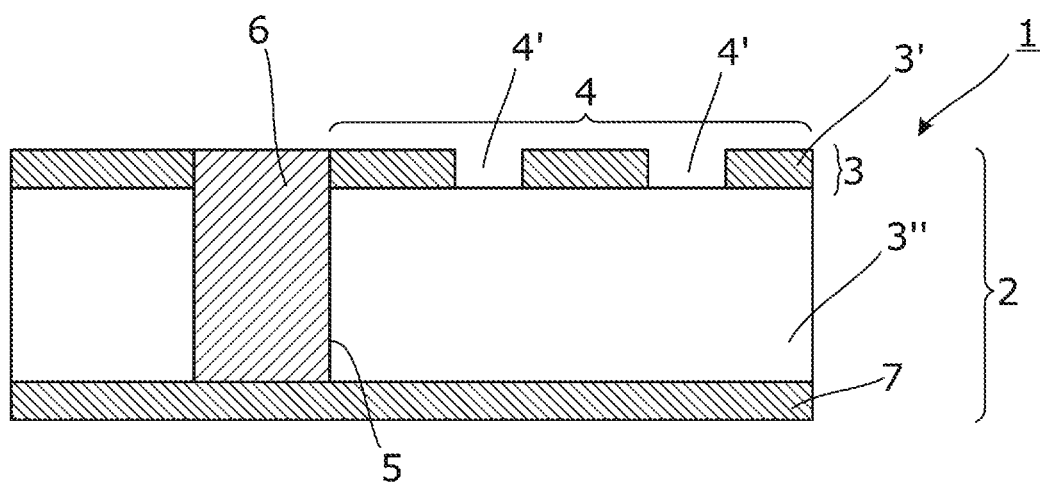
FIG. 1 shows a side-view of a semiconductor device, according to an embodiment of the present invention.

Within the description, the same reference numerals or signs have been used to denote the same parts or the like.

Referring to FIG. 1, a semiconductor device 1 is shown, according to an embodiment of a first aspect of the present invention, having at least an optically passive aspect ore device region 2 that, when semiconductor device 1 is in use, is operable in substantially an optically passive mode for the transmission and/or coupling of light from a given location to a desired location, rather than for the generation, amplification, detection and/or modulation of light. Optically passive aspect 2 is patterned to include at least a photonic structure 4 with at least a predefined structure 5. In a preferred embodiment of the present invention, optically passive aspect 2 includes at least an optical waveguide 3 and an optical cavity 4'. Optical cavity 4' can be: implemented by way of a reflector and/or a resonator in an embodiment of the present invention and formed as a constituent feature of photonic structure 4.

There is also provided at least an optically active material 6 including at least a material that is operable in substantially an optically active mode. Regarding optically active material 6, it is chosen to be suitable for light generation, amplification, detection, and/or modulation. By optically active, it is meant that optically active material 6 has a characteristic facilitating light emission, optical gain and/or a relatively high non-linearity, making it suitable for the fabrication of modulators, or having relatively high absorption properties for the fabrication of detectors. Optically active material 6 is formed in predefined structure 5, and in this way, it is optically coupled and substantially self-aligned in at least a lateral plane with optically passive aspect 2, particularly the features thereof, such as optical waveguide 3.

In an embodiment of the present invention, the optically active material is grown in a predefined structure of the photonic structure patterned in the optically passive aspect. In this way, the optically active material is substantially self-aligned in a lateral plane and optically coupled with respect to the optically passive aspect. The alignment of the optically active material with respect to the optically passive aspect and/or features thereof can be done without the need for dedicated alignment steps and/or equipment. Since the optically active material is formed in the predefined structure, which is a structural feature provided in respect of, and as inherent to, the photonic structure, a precision with which the optically active material is placed relative to the optically passive aspect and/or features thereof can depend on a respective etch process or mask accuracy that is used in patterning the optically passive aspect with the photonic structure and the features thereof. Thus, the optically active material can be laterally aligned with respect to the optically passive aspect with an accuracy of down to a few nanometers, for example, 5 nm, without the need for labour-intensive, time-consuming and expensive equipment such as electron-beam lithography whilst also being suitable for mass-fabrication. In an embodiment of the present invention, the photonic structure including the predefined structure is fabricated first and then the optically active material is formed in the predefined structure. Thus, the fabrication step by way of which the photonic structure is provided can be considered to perform a dual function. The basis of the dual function is the predefined structure of the photonic structure: firstly, it provides a growth location for the optically active material in order to facilitate optical coupling between the optically active material and the optically passive aspect and, secondly, it facilitates the self-alignment feature of an embodiment of the present invention. The optically passive aspect can also be denoted as an optically passive region of the semiconductor device.

Preferably, the optically active material is substantially selectively formed in the predefined structure. In an embodiment of the present invention, the optically active material is formed in the predefined structure, a structural feature that is provided in respect of, and inherent to, the photonic structure of an embodiment of the present invention. This feature can be considered to extend the advantage of facilitating monolithic integration of the optically active material with respect to the optically passive aspect with relative ease of implementation compared to previously-proposed techniques.

Alternatively, and desirably, the optically active material is formed relative to the optically passive aspect so as to exceed an area of the predefined structure. This feature can provide the advantage of ease of formation of the optically active material since it need not be formed precisely in and/or with respect to the predefined structure. In this regard, and preferably, the excess optically active material is removed so that the optically active material is provided in the predefined structure. The excess optically active material is desirably removed by wet-chemical etching or chemical mechanical polishing.

Preferably, a structural characteristic of the predefined structure is chosen thereby to facilitate the optically active material to be substantially self-aligned with respect to the optically passive aspect. By making an appropriate selection of one or more structural characteristics of the predefined structure such as a width, height and/or a shape thereof, the self-alignment feature of an embodiment of the present invention can be further improved and/or provided to suit, for example, an application of an embodiment of the present invention. Furthermore, any lattice mismatch between the respective materials/material systems used for the optically active material and the optically passive aspect can be addressed by way of such a selection.

Desirably, the predefined structure is a trench, a hole or a combination thereof. The predefined structure is a structural feature provided in respect of the photonic structure, and in an embodiment of the present invention is chosen to be a trench, a hole or a combination thereof. Since such features can be provided with relative ease and/or precision regarding location and/or structural characteristics, they extend to an embodiment of the present invention, the advantages of ease of implementation of the self-alignment feature and versatility since the shapes and/or sizes thereof can be adapted to target specific devices, typically in the range of 10 nanometers to 10 micrometers.

Preferably, the predefined structure is provided in a given location of the optically passive aspect. In respect of the self-alignment and optical coupling of the optically active material with the optically passive aspect, the optically active material is formed locally in the predefined structure provided in the photonic structure rather than over the whole surface of the optically passive aspect. For example, the predefined structure can be formed in the photonic structure where the integration of the laser/light source, by way of the optically active material, is anticipated. This feature of an embodiment of the present invention can extend the advantages of ease of design, fabrication and implementation of an embodiment of the present invention since the optically active material is provided relative to the optically passive aspect as desired rather than being provided generally, the latter necessitating further processing steps for the removal of the optically active material from those regions other than the predefined structure.

Desirably, the optically active material is operable to perform light generation, detection, modulation, or a combination thereof. This feature can facilitate increased versatility and application of an embodiment of the present invention to different optical systems.

Preferably, the optically active material includes at least one of: a III-V material system, a II-VI material system, a silicon nanoparticle, a silicon quantum dot, germanium and heterostructures thereof including at least one of gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, and an organic material system. Desirably, the optically active material includes a crystalline, polycrystalline, or amorphous material. An embodiment of the present invention is not limited to the use of a specific material/material system for the optically active material and, in fact, different and a broad range of materials can be used therefor, which feature can provide the advantages of increased versatility in terms of devices and/or optical systems/applications in which an embodiment of the present invention can be used. Appropriate material stacks and/or quantum dots are encompassed within the scope of the present invention for the optically active material.

Preferably, the optically passive aspect includes a multilayer structure provided on a seed layer. In a preferred embodiment of the present invention, the multilayer structure includes a silicon layer arranged on an insulator layer and the seed layer includes bulk silicon. Other appropriate material stacks are also encompassed within the scope of the present invention for the optically passive aspect.

Desirably, the optically passive aspect includes at least one of: silicon, a III-V compound semiconductor, germanium, gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, aluminium oxide, tantalum pent-oxide, hafnium dioxide, titanium dioxide, silicon dioxide, silicon nitride, and silicon oxi-nitride. An embodiment of the present invention is not limited to the use of a specific material/materials for the optically passive aspect and, in fact, different and a broad range of materials can be used therefor, which feature can provide the advantages of increased versatility in terms of devices and/or optical systems/applications in which an embodiment of the present invention can be used.

Preferably, the optically passive aspect includes an optical waveguide and an optical cavity. According to an embodiment of the present invention, the optically passive aspect can include an optical waveguide for the transmission and/or coupling of light from the predefined structure to a desired location and a cavity for the formation of a laser so as to allow the photons generated by the optically active material to travel the gain medium, thereby generating stimulated emission.

Desirably, an embodiment of the present invention includes a vertical-cavity surface-emitting laser implemented by way of alternating layers of the optically active material. This feature includes a coupling scheme for optically coupling the optically active material with the optically passive aspect by way of a vertical cavity feature. Specifically, a vertical cavity surface-emitting laser is proposed having alternating layers of optically active material that form the dielectric Bragg reflectors. An advantage of this feature can be that the coupling properties can be tuned as desired by variation of the mirror reflectivity, that is, by using more or fewer of the alternating layers of the optically active material. A further advantage of this feature can be ease of integration/implementation of an embodiment of the present invention in optical systems/applications where space economy in a lateral plane is desired. In this regard, and preferably, an emission region of the vertical-cavity surface-emitting laser is positioned relative to the optically passive aspect such that light generated by the vertical-cavity surface-emitting laser is coupled substantially in at least one of: a vertical plane relative to a surface of the optically passive aspect and laterally in an in-plane direction of the optically passive aspect. By way of this feature, light can be coupled from the vertical-cavity surface emitting laser in a desired plane or planes relative to the optically passive aspect and, thus, can extend the advantage of broadening a range of applications/optical systems in which an embodiment of the present invention can be used.

Desirably, a cross-section of the optically passive aspect in a longitudinal plane is smaller than a corresponding cross-section of the predefined structure, thereby facilitating light generated by the optically active material to be substantially coupled to the optically passive aspect. This feature is provided in relation to a first coupling scheme for optically coupling the optically active material with the optically passive aspect by way of a lateral cavity feature. Because the cross-section of the optically passive aspect in the longitudinal plane is chosen to be smaller than a corresponding cross-section of the predefined structure, light generated by the optically active material is better confined within the optically passive aspect. Thus, this feature can extend the advantages of improved optical coupling efficiency and improved device performance to an embodiment of the present invention. With respect to the afore-described feature, preferably, the optically passive aspect includes a tapered region between the smaller cross-section thereof and the predefined structure. The taper feature can be used to the advantage, to match the respective modal sizes of a light source based on the optically active material and the optically passive aspect, for example, where the light source is a III-V material system and the optically passive aspect includes a silicon optical waveguide. In this way, a modal gain of an embodiment of the present invention can be further improved.

Desirably, in an alternative embodiment of the present invention, a cross-section of the optically passive aspect in a longitudinal plane is substantially of the same size as the corresponding cross-section of the predefined structure. Fewer processing resources are needed to fabricate an embodiment of the present invention where the cross-section of the optically passive aspect and the predefined structure are substantially the same. Thus, this feature can extend the advantage of ease of fabrication and/or implementation to an embodiment of the present invention.

Preferably, and in relation to the first coupling scheme for optically coupling the optically active material and the optically passive aspect with a lateral cavity feature, the optically passive aspect includes a wire waveguide. This feature can extend the advantages of ease of fabrication and/or integration since wire waveguides, particularly, silicon wire waveguides, can be fabricated with well-established complementary metal-oxide semiconductor (CMOS) processes.

In an alternative implementation of the lateral cavity feature, there is provided a second coupling scheme for optically coupling the optically active material with the optically passive aspect having a one-dimensional photonic crystal cavity in which periodic holes are formed in an in-plane direction of the photonic structure and in a region thereof where light generated by the optically active material is substantially coupled to the optically passive aspect. Because a modal volume and/or the quality factor of a lateral cavity implemented as a one-dimensional photonic crystal cavity can be better controlled, corresponding advantages are extended, by way of the afore-described feature, to an embodiment of the present invention. In a first implementation of the one-dimensional photonic crystal cavity, it can be formed as un-chirped and un-tapered in the optically passive aspect. In this case, the optically passive aspect can be implemented as having a smaller cross-section in the longitudinal plane than the predefined structure of an embodiment of the present invention with the optically passive aspect being linked to the predefined structure by a tapered width. Advantages associated with the aforementioned first implementation include: ease of implementation, better confinement of light in the optically passive aspect and facilitating matching of the respective modes of the optically active material and the one-dimensional photonic crystal cavity. In a second implementation of the one-dimensional photonic crystal cavity, the optically passive aspect has a cross-section in a longitudinal plane that is substantially of the same size as the corresponding cross-section of the predefined structure. Such a second implementation can provide the advantage that fewer processing resources can be facilitated to produce such a structure since the optically passive aspect and the predefined structure have substantially the same size in the longitudinal plane.

In an alternative implementation of the lateral cavity feature, there is provided a third coupling scheme for optically coupling the optically active material with the optically passive aspect having a two-dimensional photonic crystal cavity in which periodic holes are formed in two in-plane directions of the photonic structure. Even better control of a modal volume and/or the quality factor in both in-plane directions can be achieved with a lateral cavity implemented as a two-dimensional photonic crystal cavity and so corresponding advantages are extended to an embodiment of the present invention. In this regard, desirably, there is provided a photonic crystal waveguide configured to couple the light generated by the optically active material to a desired location, which feature can provide improved optical coupling of light generated by the optically active material to a desired location and so facilitate improved device performance of an embodiment of the present invention.

In relation to an embodiment of the present invention having a one-dimensional photonic cavity or a two-dimensional photonic cavity, preferably, the periodic holes are substantially of the same-size. This feature has the associated advantage of ease of fabrication and/or implementation and so imparts such corresponding advantages to an embodiment of the present invention.

In relation to an embodiment of the present invention having a one-dimensional photonic cavity, a hole-size of at least some of the periodic holes is desirably tapered to progressively increase to a given size in a direction away from the predefined structure. This feature can facilitate mode-shaping of the cavity mode and higher quality factor values.

In an alternative implementation of the lateral cavity feature, there is provided a fourth coupling scheme for optically coupling the optically active material with the optically passive aspect in which an embodiment of the present invention further includes a circular grating of alternating layers of two materials, one of the materials having a lower refractive index than the other of the two materials, the predefined structure being located within a defect in the circular grating. Such a lateral cavity design can offer azimuthal symmetry resulting in a band-gap for substantially all in-plane k-vectors. Furthermore, such a cavity design can facilitate higher quality factor values to be achieved, for example, $10^6$.

According to an embodiment of the present invention, predefined structure 5 is a photonic cavity in photonic structure 4. It is preferably a trench, hole, or a combination thereof. At least a structural characteristic of predefined structure 5, such as a width, height, and/or a shape thereof, can be selected to facilitate a desired tuning of the self-alignment of optically active material 6 with respect to optically passive aspect 2. In a preferred embodiment of the present invention, the aspect ratio of predefined structure 5, that is, the ratio of its height to its width/diameter, is chosen to be greater than 1 and, more preferably, greater than 3. In an embodiment of the present invention, the aspect ratio is broadly chosen so as to facilitate aspect ratio trapping of the defects that are due to the lattice mismatch between the respective materials/material systems used for optically active material 6 and optically passive aspect 2. In a preferred embodiment of the present invention, the height of predefined structure 5 is chosen to be 1000 nm and its width/diameter is chosen to be 250 nm. An embodiment of the present invention is, of course, not limited to the given examples of the aspect ratio, height and/or width dimensions for predefined structure 5, and in fact any other sizes falling within the scope of the present invention can be used.

According to an embodiment of the present invention, predefined structure 5 is provided in a given location of optically passive aspect 2. In respect of the self-alignment and optical coupling of optically active material 6 with optically passive aspect 2, the optically active material is formed locally in predefined structure 5 provided in photonic structure 4 rather than over the whole surface of optically passive aspect 2. In this regard, predefined structure 5 is formed in photonic structure 4 where the integration of the laser/light source, by way of optically active material 6, is anticipated.

According to an embodiment of the present invention, predefined structure 5 can be an aperture having an insulating material or a blocking p-n junction. The insulating material is formed on the outer walls of predefined structure 5 and can be selected from one of: silicon, germanium, gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, aluminium oxide, tantalum pent-oxide, hafnium dioxide, titanium dioxide, silicon dioxide, silicon nitride, and silicon oxi-nitride. Of course, an embodiment of the present invention is not limited to the use of such materials and any other suitable materials for the blocking p-n junction or the insulating material for the predefined structure 5 are encompassed within the scope of the present invention.

Regarding the formation of optically active material 6 in predefined structure 5, two methods are proposed in an embodiment of the present invention. In one method, selective epitaxial growth is done in which optically active material 6 is substantially selectively formed in predefined structure 5. In another method, height selective epitaxial growth of optically active material 6 is done in which it is formed relative to a surface of optically passive aspect 2 in which predefined structure 5 is formed so as to exceed at least an area of predefined structure 5. Thus, optically active material 6 is formed relative to optically passive aspect 2 so as to at least be formed in and around predefined structure 5. Excess optically active material 6, which can be any of optically active material 6 around predefined structure 5 and/or on optically passive aspect 2, is removed so that optically active material 6 is provided in predefined structure 5. Removal of excess optically active material 6 can be done by wet-chemical etching, chemical mechanical polishing, or any other suitable method for this purpose.

According to an embodiment of the present invention, for optically active material 6, a wide and diverse range of materials and/or material systems can be used, for example, a III-V material system, a II-VI material system, at least a silicon nanoparticle, at least a silicon quantum dot, germanium, and heterostructures thereof having at least one of gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, and an organic material system. Regarding the organic material system, laser dyes and/or other relatively highly non-linear polymers are encompassed within the scope of the present invention. In this regard, those polymers with a relatively low oscillator strength and large exciton radius can exhibit a relatively high non-linearity and so are considered to be encompassed within the scope of the present invention. For the optically active material 6, a crystalline material such as crystalline silicon, polycrystalline material such as polycrystalline silicon or amorphous material such as amorphous silicon, amorphous barium titanate, can be used in an embodiment of the present invention. The aforementioned materials/material systems have been given by way of example. An embodiment of the present invention is not limited to the use thereof and any other materials/material systems that can fall within the scope of the present invention for optically active material 6 are considered to be included within the ambit of the present invention. Generally, for optically active material 6, those materials/material systems having a band-gap characteristic such that they exhibit a relatively high non-linearity, that is, a relatively high optical gain and high absorption, suited for a given application defined by a given target wavelength, can be used in an embodiment of the present invention.

Referring again to FIG. 1, optically passive aspect 2 can be implemented so as to include a multilayer structure 3', 3" provided on at least a seed layer 7. In a preferred embodiment of the present invention, the multilayer structure includes at least a topmost silicon layer 3' arranged on an underlying insulator layer 3" and seed layer 7 includes bulk silicon. Optical waveguide aspect 3 of optically passive aspect 2 is patterned substantially in topmost silicon layer 3' of multilayer structure 3', 3". By forming optically active material 6 in predefined structure 5, optically active material 6 is substantially self-aligned laterally with optically passive aspect 2, particularly optical waveguide 3, as can be clearly seen from FIG. 1.

According to an embodiment of the present invention, optically active material 6 can be selected so as to have an emission wavelength that is substantially matched with a transmission range of optically passive aspect 2, and particularly of optical waveguide 3. By way of example, if optical waveguide 3 includes a silicon waveguide, optically active material 6 can be selected so as to have a transmission range larger than 1100 nm. In this regard, such a wavelength range can be obtained for optically active material 6 being: InAs quantum dots capped with GaAs; (In, Ga)As, (In, Ga)(As, N) or (In, Ga)(As, N, Sb), (In, Ga)(As N) quantum wells; InGaAsP quantum wells; InAsP quantum wells; NAsP or other III-V compound materials.

Figure 2A:
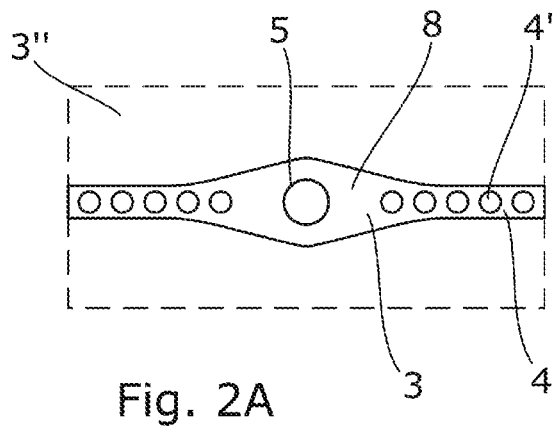
FIG. 2a shows a step of a method for fabricating the semiconductor device where a photonic structure is formed in an optically passive aspect, according to an embodiment of the present invention.
Figure 2B:
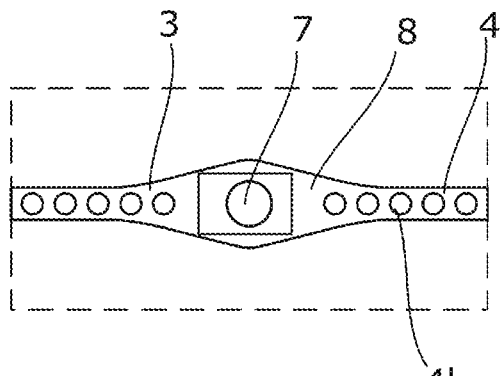
FIG. 2b shows a step of the method for fabricating the semiconductor device where a lithography step is performed at the location of a predefined structure, according to an embodiment of the present invention.
Figure 2C:
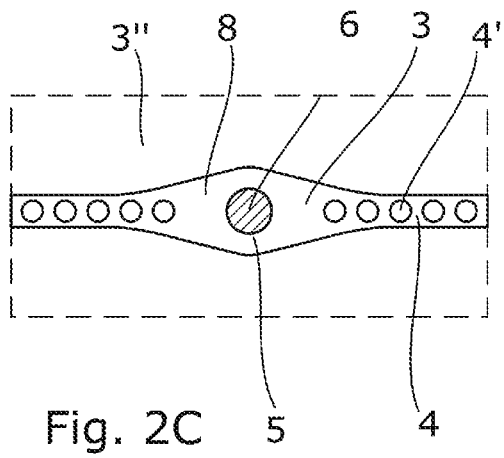
FIG. 2c shows a step of the method for fabricating the semiconductor device where an optically active material is selectively grown in the predefined structure, according to an embodiment of the present invention.

Referring to FIGS. 2a-2c, the fabrication stages of an embodiment according to the first aspect of the present invention are illustrated. As can be seen from FIG. 2a, photonic structure 4 having periodic holes 4' is formed in optically passive aspect 2. Periodic holes 4' can include a material of lower refractive index than that used for photonic structure 4, such as air. Photonic structure 4 is also formed so as to include a predefined structure 5, which, in the present example, is shown as a hole 5 of larger diameter than periodic holes 4'. In the present example, optically passive aspect 2 includes a multilayer structure 3', 3" provided on a seed layer 7 with the multilayer structure having a topmost silicon layer 3' provided on an underlying insulator/buried oxide layer 3" and seed layer 7 being bulk silicon as described above with reference to FIG. 1. Photonic structure 4 is formed in multilayer structure 3', 3" such that periodic holes 4' are formed in topmost silicon layer 3' giving access to underlying insulator/buried oxide layer 3". Then, and as illustrated by FIG. 2b, a lithography step, such as etching, is performed at the location of predefined structure 5 so as to open insulator/buried oxide layer 3" and to give access to seed layer 7, such selective etching being performed by covering substantially all but predefined structure 5 of optically passive aspect 2 with photoresist, for example. In this regard, the alignment tolerances are relatively non-stringent due to the selectivity of the etching process not attacking the silicon 3', 7 but insulator/buried oxide layer 3". As illustrated by FIG. 2c, optically active material 6, which in the present example is based on a III-V material system, is selectively grown in predefined structure/oxide aperture 5. Alternatively, and with respect to FIG. 2c, optically active material 6 can also be grown on a larger area on the surface of optically passive aspect 2 in which predefined structure 5 is formed and then excessive optically active material 6 is removed from everywhere but predefined structure 5 using lithography and the non-stringent alignment tolerances, as mentioned above.

Generally, and with regard to an embodiment of the present invention, the light source can only be located in optically active material 6 and exhibits optically or electrically pumped emission. While silicon does not exhibit sufficient photoluminescence efficiency due to its indirect band-gap, it offers relatively low-propagation loss and dispersion. Furthermore, it can be fabricated with well-established CMOS processes, which makes it attractive for use as wave-guiding material that can be integrated with ease and fabricated in a cost-effective manner. Thus, in a preferred embodiment, optically active material 6 is based on a III-V based material system and optical waveguide 3 is implemented by way of a silicon waveguide. In this regard, light generated by optically active material 6 has to be transferred to silicon waveguide 3, which is done by different coupling schemes that are described below.

Figure 3A:
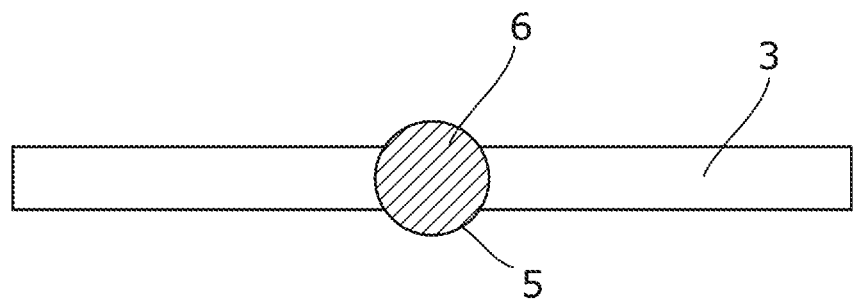
FIG. 3a illustrates a first coupling scheme with a lateral cavity feature where the cross-section of a silicon waveguide is smaller than a corresponding cross-section of the predefined structure, according to embodiment of the present invention.
Figure 3B:
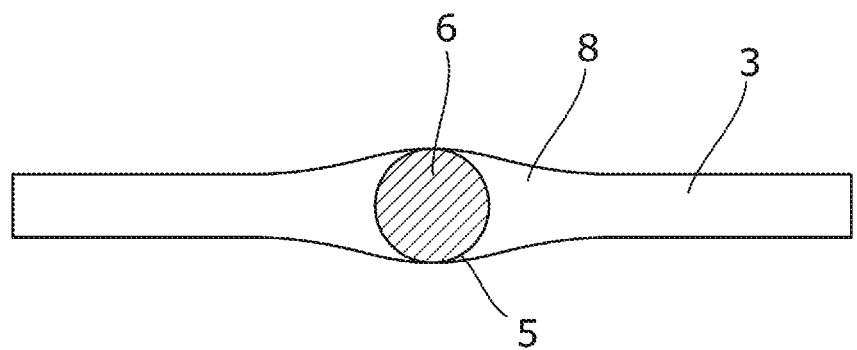
FIG. 3b illustrates a first coupling scheme with a lateral cavity feature where a tapered region is provided between the smaller cross-section of the silicon waveguide and the predefined structure, according to an embodiment of the present invention.

Referring to FIGS. 3a and 3b, a first coupling scheme with a lateral cavity feature according to an embodiment of the present invention is illustrated. As shown in FIG. 3a, a cross-section of silicon waveguide 3 in a longitudinal plane is smaller than a corresponding cross-section of predefined structure 5, which is shown as hole-shaped in the present example. This feature facilitates light generated by III-V based light source 6 to be substantially coupled to and better confined within silicon waveguide 3. In a modification made to an embodiment of the present invention as shown in FIG. 3b, a tapered region 8 is provided between the smaller cross-section of silicon waveguide 3 and predefined structure 5. Taper feature 8 can be used to advantage to match the respective modal sizes of the III-V based light source and silicon waveguide 3, which adiabatically taper the modal size of the light.

Referring to FIGS. 4a-4e, a second coupling scheme with a lateral cavity feature for optically coupling III-V based light source 6 to silicon waveguide 3 is illustrated. The second coupling scheme is based on photonic structure 4 having at least a one-dimensional photonic crystal cavity 10 in which periodic holes 4' are formed in an in-plane direction of photonic structure 4 and in a region thereof where light generated by III-V based light source 6 is substantially coupled to the silicon waveguide 3. The use of relatively high-reflective materials such as silicon and III-V materials facilitates vertical and in-plane confinement by way of index-guiding. The second coupling scheme according to an embodiment of the present invention is not limited to the formation of one-dimensional photonic cavity 10 in silicon waveguide 3 as shown in any one of FIGS. 4a-4e. Indeed, mixed cavities with periodic holes/reflectors 4' being partially located in the III-V material system on which light source 6 is based and in the silicon forming the basis of waveguide 3 are also considered as encompassed within the scope of the present invention.

As can be clearly seen, FIG. 4a and corresponding FIG. 4b pertain to when predefined structure 5 is implemented as a trench and FIG. 4c and corresponding FIG. 4d relate to where predefined structure 5 is implemented as a hole. In FIGS. 4a-4d, it can be seen that silicon waveguide 3 is implemented as having a smaller cross-section in the longitudinal plane as compared to the corresponding dimension of predefined structure 5 and it has a tapered width 8 where it is linked to predefined structure 5. In FIGS. 4a and 4c, periodic holes 4' are substantially of the same size. Advantages associated with the embodiments of the present invention as shown in FIGS. 4a and 4c include: ease of implementation since periodic holes 4' are substantially of the same size, better confinement of light in silicon waveguide 3 since it has a smaller cross-section in the longitudinal plane than predefined structure 5 and facilitating matching of the respective modes of III-V based light source 6 and one-dimensional photonic crystal cavity 10 by way of tapered region 8 of silicon waveguide 3. In contrast to FIGS. 4a and 4c, according to an embodiment of the present invention as shown in FIGS. 4b and 4d, periodic holes 4' are implemented as progressively increasing to a given size in a direction away from predefined structure 5, where the given size can be substantially compatible to a width of silicon waveguide 3 in the longitudinal plane, for example. Such an implementation has, in addition to the advantages described above with reference to FIGS. 4a and 4c, the advantage that the tapered holes facilitate mode-shaping of the cavity mode and higher quality-factor values.

FIG. 4e shows a second implementation of one-dimensional photonic crystal cavity 10 in which the silicon waveguide 3 has a cross-section in a longitudinal plane that is substantially of the same size as the corresponding cross-section of predefined structure 5. Such a second implementation can provide the advantage that fewer processing resources can be facilitated to produce such a structure since silicon waveguide 3 and predefined structure 5 have substantially the same size in the longitudinal plane. Since periodic holes 4' of photonic structure 4 are implemented as progressively increasing to a given size in a direction away from predefined structure 5, an embodiment of the present invention as shown in FIG. 4e, can provide the further advantage of mode-shaping of the cavity mode and higher quality-factor values.

Figure 5:
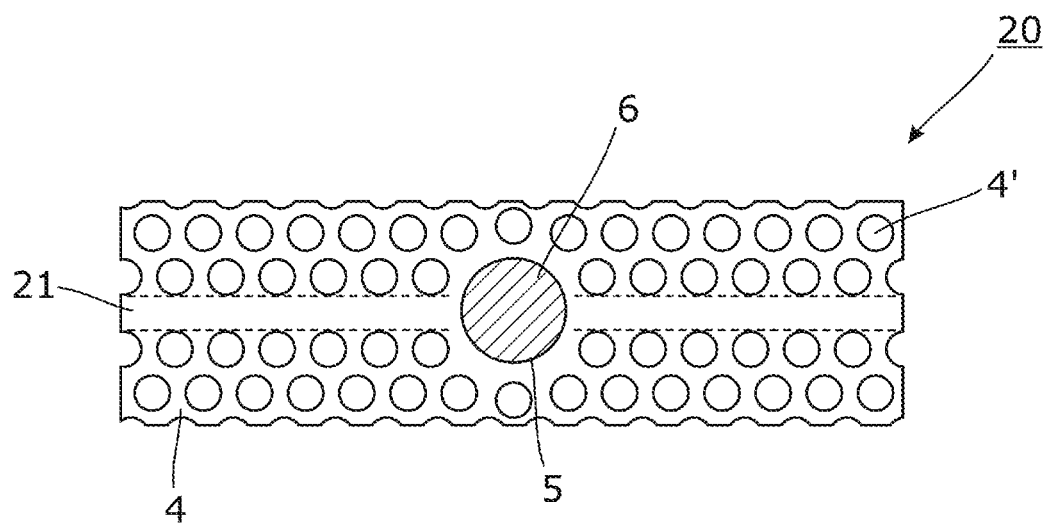
FIG. 5 illustrates a third coupling scheme with a lateral cavity feature where the photonic structure includes a two-dimensional photonic crystal cavity with periodic holes of substantially the same size, according to an embodiment of the present invention.

In an alternative implementation of the lateral cavity feature and as shown in FIG. 5, there is provided a third coupling scheme for optically coupling III-V based light source 6 with silicon waveguide 3 in which photonic structure 4 includes at a two-dimensional photonic crystal cavity 20 in which periodic holes 4' of substantially the same size are formed in two in-plane directions of photonic structure 4. In this regard, within two-dimensional photonic crystal cavity 20, a defect is formed, corresponding to where III-V based light source 6 is implemented, by the III-V material being formed in predefined structure 5. Light generated by III-V based light source 6 is confined within the defect; it is coupled to a desired location by way of a photonic crystal waveguide 21.

Figure 6:
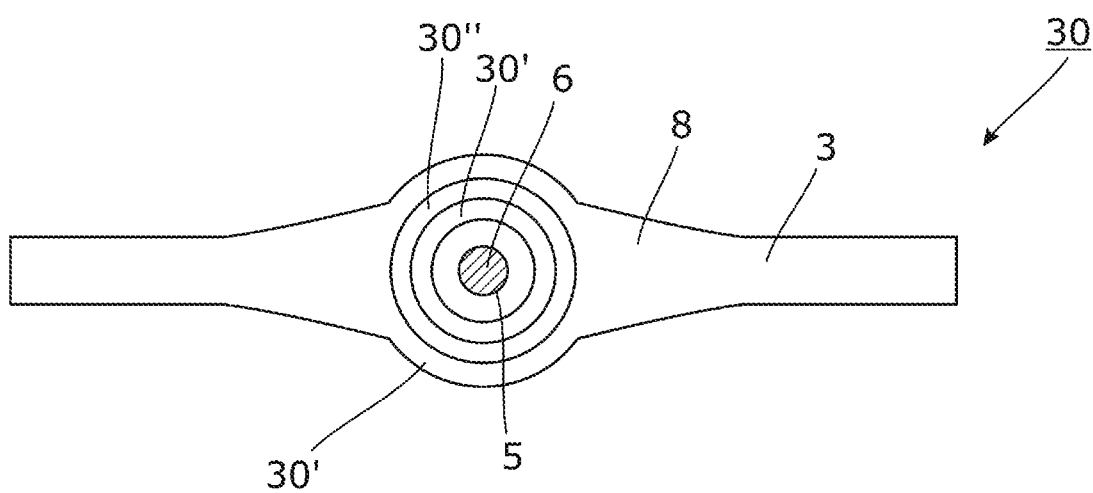
FIG. 6 illustrates a fourth coupling scheme with a lateral cavity feature where the silicon waveguide includes a circular grating of alternating layers of two materials, with one material having a lower refractive index than the other, according to an embodiment of the present invention.

In an alternative implementation of the lateral cavity feature as shown in FIG. 6, there is provided a fourth coupling scheme for optically coupling III-V based light source 6 with silicon waveguide 3. As shown in one example of the fourth coupling scheme, silicon waveguide 3 includes at least a circular grating 30 of alternating layers 30', 30" of at least two materials, one of the materials having a lower refractive index than the other of the two materials, predefined structure 5 being located within a defect in circular grating 30. According to an embodiment of the present invention as shown in FIG. 6, cavity mirrors 30', 30" can be entirely formed in silicon/wave-guiding material 3 with the III-V material having the defect. Cavity mirrors 30', 30" can be formed with alternating layers of dielectric and/or non-III-V material systems, for example, silicon dioxide. The surrounding refractive index of silicon is about 3.48, whereas the defect preferably has a lower refractive index, most preferably lower than 3.4. Furthermore, silicon waveguide 3 includes a tapered region 8 that can facilitate matching of the respective cavity modes and the waveguide mode.

Figure 7A:
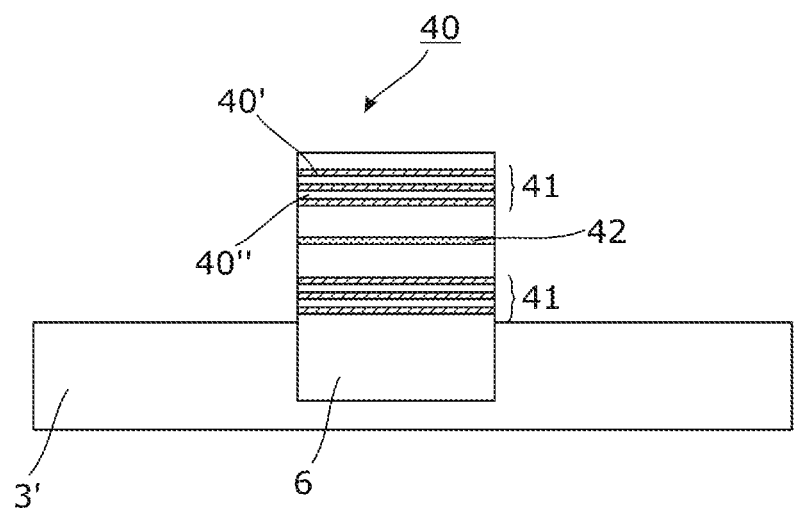
FIG. 7a illustrates a coupling scheme with a vertical cavity feature where an emission region of a vertical-cavity, surface emitting laser generates light that is coupled in a vertical plane relative to the surface of the silicon waveguide, according to an embodiment of the present invention.
Figure 7B:
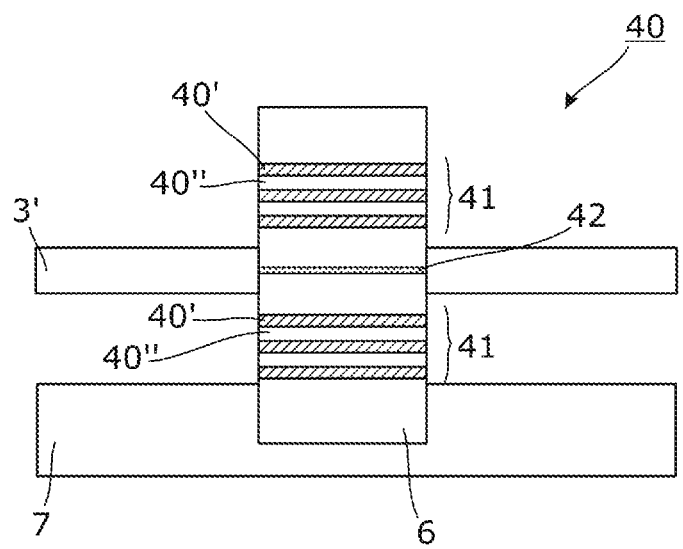
FIG. 7b illustrates a coupling scheme with a vertical cavity feature where the emission region of the vertical-cavity, surface emitting laser generates light that is coupled laterally in an in-plane direction of the silicon waveguide, according to an embodiment of the present invention.

Referring to FIGS. 7a and 7b, a coupling scheme for optically coupling III-V based light source 6 to silicon waveguide 3 based on a vertical cavity feature 40 is illustrated. According to an embodiment of the present invention, vertical cavity feature 40 is implemented by way of a vertical-cavity, light-emitting structure such as a vertical-cavity, surface-emitting laser. Vertical-cavity, surface-emitting laser 40 is implemented by way of alternating layers 40', 40" of the III-V material, which form dielectric Bragg reflectors/mirrors 41. Stacked multiple layers 40', 40" have alternating refractive indices and typically also differ in their band-gap, thus facilitating a Bragg reflector 41 having close to unity reflection. This facilitates relatively low-threshold, high-power vertically-emitting lasers and/or light-emitting diodes to be produced in an embodiment of the present invention.

FIG. 7a shows an embodiment of the present invention where an emission of vertical-cavity, surface-emitting laser 40 is such that the light it generates is coupled in substantially a vertical plane relative to a surface of silicon waveguide 3. In this regard, and viewing FIG. 7a in conjunction with FIG. 1, vertical-cavity, surface-emitting laser 40 is formed on topmost silicon layer 3' of multilayer structure 3', 3" of optically passive aspect 2.

FIG. 7b shows an embodiment of the present invention in which at least an emission region 42 of the vertical-cavity, surface-emitting laser is such that the light it generates is coupled substantially laterally in an in-plane direction of silicon waveguide 3. In this regard, and viewing FIG. 7b in conjunction with FIG. 1, vertical-cavity, surface-emitting laser 40 is formed on seed/bulk silicon layer 7. An advantage associated with an embodiment of the present invention as shown in FIG. 7b is that a top and bottom mirrors 41' are facilitated. In contrast, only a top mirror 41' is facilitated in an embodiment of the present invention as shown in FIG. 7a.

The respective vertical cavity designs shown in FIGS. 7a and 7b can be implemented in isolation or in combination with any one of the lateral cavity features described above with reference to FIGS. 3-6. Furthermore, the mirrors/reflectors in FIGS. 7a and 7b can be implemented by way of high contrast gratings rather than dielectric Bragg mirrors, which can facilitate more compact structures to be facilitated. The growth position of III-V material/optically active material 6 is determined by the position of predefined structure 5, which defines the access point of the gaseous and molecular precursors during metal organic chemical vapour deposition and molecular beam epitaxial growth, respectively.

Regarding optically coupling III-V based light source 6 to silicon waveguide 3, hybrid structures with III-V/silicon mixed resonators and/or three-dimensional cavities can be contemplated within the scope of an embodiment of the present invention.

Embodiments of the present invention have been described purely by way of example and modifications of detail can be made within the scope of the invention.

Each feature disclosed in the description, and where appropriate, the claims and the drawings, can be provided independently or in any appropriate combination.

What is claimed is:

1. A method for fabricating a semiconductor device for use in an optical application, the method comprising:
   providing an optically passive aspect that is operable in a substantially optically passive mode;
   providing an optically active material having a material that is operable in a substantially optically active mode;
   wherein the optically passive aspect is patterned to include a photonic structure with a predefined structure;
   wherein the optically active material is formed in the predefined structure so as to be substantially self-aligned in a lateral plane with the optically passive aspect; and
   wherein the optically active material is formed relative to the optically passive aspect so as to exceed an area of the predefined structure.

2. The method according to claim 1, wherein the optically active material is substantially selectively formed in the predefined structure.

3. The method according to claim 1, wherein excess optically active material is removed so that the optically active material is provided in the predefined structure.

4. The method according to claim 3, wherein the excess optically active material is removed by wet-chemical etching or chemical mechanical polishing.

5. The method according to claim 1, wherein a structural characteristic of the predefined structure is chosen to facilitate the optically active material to be substantially self-aligned with respect to the optically passive aspect.

6. The method according to claim 1, wherein the predefined structure is provided in a given location of the optically passive aspect.

7. The method according to claim 1, wherein the optically active material is operable to perform light generation, amplification, detection, modulation, or a combination thereof.

8. The method according to claim 1, wherein the optically active material comprises at least one of: a III-V material system, a II-VI material system, a silicon nanoparticle, a silicon quantum dot, germanium and heterostructures thereof comprising at least one of: gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, and an organic material system.

9. The method according to claim 1, wherein the optically active material comprises a crystalline, polycrystalline, or amorphous material.

10. The method according to claim 1, wherein the optically passive aspect comprises a multilayer structure provided on a seed layer.

11. The method according to claim 1, wherein the optically passive aspect comprises at least one of: silicon, a III-V compound semiconductor, germanium, gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, aluminium oxide, tantalum pent-oxide, hafnium dioxide, titanium dioxide, silicon dioxide, silicon nitride, and silicon oxi-nitride.

12. The method according to claim 1, wherein the optically passive aspect comprises an optical waveguide and an optical cavity.

13. The method according to claim 1, wherein a cross-section of the optically passive aspect in a longitudinal plane is substantially of the same size as the corresponding cross-section of the predefined structure.

14. The method according to claim 1, wherein the optically passive aspect comprises a wire waveguide.

15. A method for fabricating a semiconductor device for use in an optical application, the method comprising:
    providing an optically passive aspect that is operable in a substantially optically passive mode;
    providing an optically active material having a material that is operable in a substantially optically active mode; and
    providing a vertical-cavity surface-emitting laser implemented by way of alternating layers of the optically active material;
    wherein the optically passive aspect is patterned to include a photonic structure with a predefined structure; and
    wherein the optically active material is formed in the predefined structure so as to be substantially self-aligned in a lateral plane with the optically passive aspect.

16. The method according to claim 15, wherein an emission region of the vertical-cavity surface-emitting laser is positioned relative to the optically passive aspect such that light generated by the vertical-cavity surface-emitting laser is coupled substantially in at least one of: a vertical plane relative to a surface of the optically passive aspect and laterally in an in-plane direction of the optically passive aspect.

17. The method according to claim 16, further comprising providing a two-dimensional photonic crystal cavity in which periodic holes are formed in two in-plane directions of the photonic structure.

18. The method according to claim 17, further comprising providing a photonic crystal waveguide configured to couple the light generated by the optically active material to a desired location.

19. A method for fabricating a semiconductor device for use in an optical application, the method comprising:
    providing an optically passive aspect that is operable in a substantially optically passive mode;
    providing an optically active material having a material that is operable in a substantially optically active mode;
    wherein the optically passive aspect is patterned to include a photonic structure with a predefined structure;
    wherein the optically active material is formed in the predefined structure so as to be substantially self-aligned in a lateral plane with the optically passive aspect; and
    wherein a cross-section of the optically passive aspect in a longitudinal plane is smaller than a corresponding cross-section of the predefined structure, thereby facilitating light generated by the optically active material to be substantially coupled to the optically passive aspect.

20. The method as claimed in claim 19, wherein the optically passive aspect comprises a tapered region between the smaller cross-section and the predefined structure.

21. The method as claimed in claim 20, further comprising a one-dimensional photonic crystal cavity in which periodic holes are formed in an in-plane direction of the photonic structure and in a region thereof where light generated by the optically active material is substantially coupled to the optically passive aspect.

22. The method as claimed in claim 21, wherein the periodic holes are substantially of the same-size.

23. The method as claimed in claim 21, wherein a hole-size of at least some of the periodic holes is tapered to progressively increase to a given size in a direction away from the predefined structure.

24. A method for fabricating a semiconductor device for use in an optical application comprising:
    providing an optically passive aspect that is operable in a substantially optically passive mode;
    providing an optically active material having a material that is operable in a substantially optically active mode; and
    providing a circular grating of alternating layers of two materials, one of the materials having a lower refractive index than the other of the two materials, the predefined structure being located within a defect in the circular grating;
    wherein the optically passive aspect is patterned to include a photonic structure with a predefined structure; and
    wherein the optically active material is formed in the predefined structure so as to be substantially self-aligned in a lateral plane with the optically passive aspect.

* * * * *